United States Patent
Choo

(10) Patent No.: US 10,095,577 B2
(45) Date of Patent: Oct. 9, 2018

(54) MEMORY SYSTEM AND OPERATING METHOD THEREOF

(71) Applicant: SK hynix Inc., Icheon-si, Gyeonggi-do (KR)

(72) Inventor: Heon Jin Choo, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/637,062

(22) Filed: Jun. 29, 2017

(65) Prior Publication Data

US 2018/0113758 A1 Apr. 26, 2018

(30) Foreign Application Priority Data

Oct. 26, 2016 (KR) .................. 10-2016-0140012

(51) Int. Cl.
| | |
|---|---|
| *G11C 16/06* | (2006.01) |
| *G06F 11/10* | (2006.01) |
| *G11C 16/28* | (2006.01) |
| *G11C 29/52* | (2006.01) |
| *H03M 13/11* | (2006.01) |
| *G11C 29/02* | (2006.01) |
| *G11C 29/42* | (2006.01) |

(52) U.S. Cl.
CPC .......... *G06F 11/1012* (2013.01); *G11C 16/28* (2013.01); *G11C 29/021* (2013.01); *G11C 29/028* (2013.01); *G11C 29/42* (2013.01); *G11C 29/52* (2013.01); *H03M 13/1102* (2013.01)

(58) Field of Classification Search
CPC ..... G06F 11/1012; G11C 16/28; G11C 29/52; H03M 13/1102
USPC .................... 365/203, 205, 185.21
See application file for complete search history.

(56) References Cited

U.S. PATENT DOCUMENTS 9,405,615 B2 * 8/2016 Sunwoo .................. G06F 11/10
2017/0162259 A1 * 6/2017 Kim ..................... G11C 11/5642

FOREIGN PATENT DOCUMENTS

| KR | 1020130084901 A | 7/2013 |
|---|---|---|
| KR | 1020140118555 A | 10/2014 |

* cited by examiner

*Primary Examiner* — Huan Hoang
(74) *Attorney, Agent, or Firm* — William Park & Associates Ltd.

(57) ABSTRACT

Provided herein is a memory system and an operation method thereof. The memory system may include a memory controller including a read retry table in which a plurality of codes are stored, and configured to output a selected code among the plurality of codes during a read retry operation. The memory system may include a memory device configured to store data, and perform the read retry operation according to the codes received from the memory controller.

24 Claims, 12 Drawing Sheets

FIG. 11

| INDEX(ID) | RV# |
|---|---|
| ID1 | RV1 | ---▶ V1
| ID2 | RV2 | ---▶ V2
| ID3 | RV3 | ---▶ V3
| ⋮ | ⋮ | ⋮
| IDk | RVk | ---▶ Vk

FIG. 12

| INDEX(ID) | RVI# |
|---|---|
| ID1 | RVI1 | ---▶ V1+I1
| ID2 | RVI2 | ---▶ V2+I2
| ID3 | RVI3 | ---▶ V3+I3
| ⋮ | ⋮ | ⋮
| IDk | RVIk | ---▶ Vk+Ik

FIG. 13

| INDEX(ID) | RI# |
|---|---|
| ID1 | RI1 | ---▶ I1
| ID2 | RI2 | ---▶ I2
| ID3 | RI3 | ---▶ I3
| ⋮ | ⋮ | ⋮
| IDk | RIk | ---▶ Ik

| INDEX(IDab) | RV1 | RV2 | RV3 | RV4 | RV5 | RV6 | RV7 |
|---|---|---|---|---|---|---|---|
| ID1b | RV11 | RV12 | RV13 | RV14 | RV15 | RV16 | RV17 |
| ID2b | RV21 | RV22 | RV23 | RV24 | RV25 | RV26 | RV27 |
| ID3b | RV31 | RV32 | RV33 | RV34 | RV35 | RV36 | RV37 |
| ⋮ | ⋮ | ⋮ | ⋮ | ⋮ | ⋮ | ⋮ | ⋮ |
| IDab | RVa1 | RVa2 | RVa3 | RVa4 | RVa5 | RVa6 | RVa7 |

FIG. 16

| INDEX(IDab) | RVI1 | RVI2 | RVI3 | RVI4 | RVI5 | RVI6 | RVI7 |
|---|---|---|---|---|---|---|---|
| ID1b | RVI11 | RVI12 | RVI13 | RVI14 | RVI15 | RVI16 | RVI17 |
| ID2b | RVI21 | RVI22 | RVI23 | RVI24 | RVI25 | RVI26 | RVI27 |
| ID3b | RVI31 | RVI32 | RVI33 | RVI34 | RVI35 | RVI36 | RVI37 |
| ⋮ | ⋮ | ⋮ | ⋮ | ⋮ | ⋮ | ⋮ | ⋮ |
| IDab | RVIa1 | RVIa2 | RVIa3 | RVIa4 | RVIa5 | RVIa6 | RVIa7 |

FIG. 17

| INDEX(IDab) | RI1 | RI2 | RI3 | RI4 | RI5 | RI6 | RI7 |
|---|---|---|---|---|---|---|---|
| ID1b | RI11 | RI12 | RI13 | RI14 | RI15 | RI16 | RI17 |
| ID2b | RI21 | RI22 | RI23 | RI24 | RI25 | RI26 | RI27 |
| ID3b | RI31 | RI32 | RI33 | RI34 | RI35 | RI36 | RI37 |
| ⋮ | ⋮ | ⋮ | ⋮ | ⋮ | ⋮ | ⋮ | ⋮ |
| IDab | RIa1 | RIa2 | RIa3 | RIa4 | RIa5 | RIa6 | RIa7 |

MEMORY SYSTEM AND OPERATING METHOD THEREOF

CROSS-REFERENCE TO RELATED APPLICATION

The present application claims priority under 35 U.S.C. § 119(a) to Korean patent application 10-2016-0140012 filed on Oct. 26, 2016 in the Korean Intellectual Property Office, the entire disclosure of which is incorporated by reference herein.

BACKGROUND

1. Technical Field

Various embodiments of the present disclosure may generally relate to a memory system and an operating method thereof, and more particularly, to a memory system relating to a read retry operation.

2. Related Art

A memory system may include a memory device which stores data and a memory controller which controls commands, addresses and data transmissions between the memory device and an external device.

The memory device may include a plurality of memory devices. The memory devices may be classified into volatile memory devices or nonvolatile memory devices according to a data storage method.

The external device may generally be called a host, and may use, to communicate with the memory device, an interface protocol such as a PCI-E (Peripheral Component Interconnect-Express), an ATA (Advanced Technology Attachment), an SATA (Serial ATA), a PATA (Parallel ATA) or an SAS (serial attached SCSI). The interface protocol between the external device and the memory device is not limited to the above-described examples, and may include various interfaces such as a Universal Serial Bus (USB), a Multi-Media Card (MMC), an Enhanced Small Disk Interface (ESDI), or Integrated Drive Electronics (IDE).

SUMMARY

According to an embodiment, an operating method of a memory system may be provided. According to an embodiment, a memory system may be provided. The memory system may include a memory controller including a read retry table in which a plurality of codes are stored, and configured to output a selected code among the plurality of codes during a read retry operation. The memory system may include a memory device configured to store data, and perform the read retry operation according to the codes received from the memory controller. [The abstract was relatively broadened.

BRIEF DESCRIPTION OF THE DRAWINGS

FIG. 11 is a diagram illustrating first embodiments of the read retry table that is used for the read retry operation described with reference to FIG. 10.

FIG. 12 is a diagram illustrating second embodiments of the read retry table that is used for the read retry operation described with reference to FIG. 10.

FIG. 13 is a diagram illustrating third embodiments of the read retry table that is used for the read retry operation described with reference to FIG. 10.

FIG. 16 is a diagram illustrating second embodiments of the read retry table that is used for the read retry operation described with reference to FIG. 14.

FIG. 17 is a diagram illustrating third embodiments of the read retry table that is used for the read retry operation described with reference to FIG. 14.

DETAILED DESCRIPTION

Figure 1:
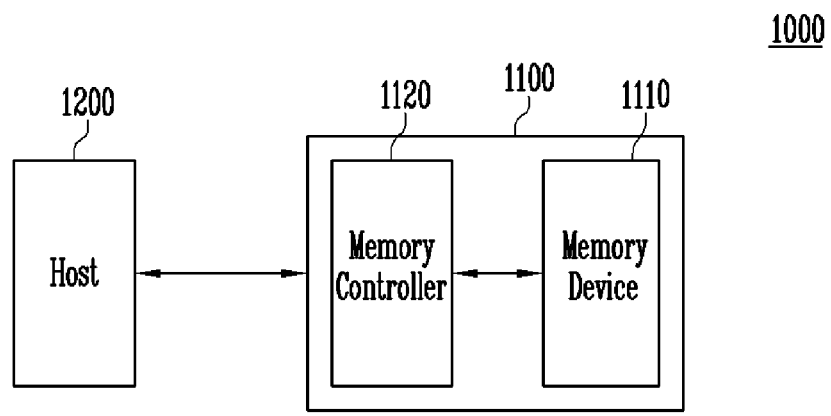
FIG. 1 is a diagram illustrating a memory system according to an embodiment of the present disclosure.

Hereinafter, embodiments will be described with reference to the accompanying drawings. However, these embodiments may be embodied in different forms and should not be construed as limited to the embodiments set forth herein. Rather, these embodiments are provided so that this disclosure will be thorough and complete, and will fully convey the scope of the examples of embodiments to those skilled in the art. Embodiments are described herein with reference to cross-sectional illustrations that are schematic illustrations of embodiments (and intermediate structures). In the drawing figures, dimensions may be exaggerated for clarity of illustration. It will be understood that when an element is referred to as being "between" two elements, it can be the only element between the two elements, or one or more intervening elements may also be present. Also, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a memory system which may improve the reliability of a read operation of the memory system by changing sensing current depending on threshold voltages of memory cells, and an operating method thereof.

FIG. 1 is a diagram illustrating a memory system according to an embodiment of the present disclosure.

Referring to FIG. 1, a storage system 1000 may be formed of a memory system 1100 which stores data, and a host 1200.

The memory system 1100 may include a memory device 1110 which stores data, and a memory controller 1120 which controls the memory device 1110. The memory system 1100 may be coupled to the host 1200 and store data in response to a request from the host 1200, or output the stored data to the host 1200.

The host 1200 may use, to communicate with the memory system 1100, an interface protocol such as, for example but not limited to, a PCI-E (peripheral component interconnect-express), an ATA (advanced technology attachment), an SATA (serial ATA), a PATA (parallel ATA) or an SAS (serial attached SCSI). In addition, the interface protocol between the host 1200 and the memory system 1100 is not limited to the above-described examples, and may be one of other interface protocols such as, for example but not limited to, a Universal Serial Bus (USB), a Multi-Media Card (MMC), an Enhanced Small Disk Interface (ESDI), or Integrated Drive Electronics (IDE).

The memory controller 1120 may control the overall operation of the memory system 1100 and control data exchange between the host 1200 and the memory device 1110. For example, the memory controller 1120 may control the memory device 1110 such that a program, read, or erase operation is performed according to a request from the host 1200. For instance, with regard to a read operation, the memory controller 1120 may transmit a read command and an address needed to output data stored in the memory device 1110, and various codes required for the read operation, to the memory device 1110, and output data received from the memory device 1110 as data that can be recognized by the host 1200. While the read operation is performed, in the case where there are many errors in data read from the memory device 1110, a read retry operation may be performed. For example, the memory device 1110 may transmit information about whether a read operation has passed or failed to the memory controller 1120. In the case where the memory controller 1120 receives fail information, the memory controller 1120 may change codes required for the read operation and transmit them to the memory device 1110. The memory device 1110 may perform the read operation again according to the changed codes.

The memory device 1110 may include a plurality of memory devices. The memory device 1110 may include, for example but not limited to, a DDR SDRAM (double data rate synchronous dynamic random access memory), an LPDDR4 (low power double data rate4) SDRAM, a GDDR (graphics double data rate) SDRAM, an LPDDR (low power DDR), a RDRAM (rambus dynamic random access memory) or a flash memory.

Figure 2:
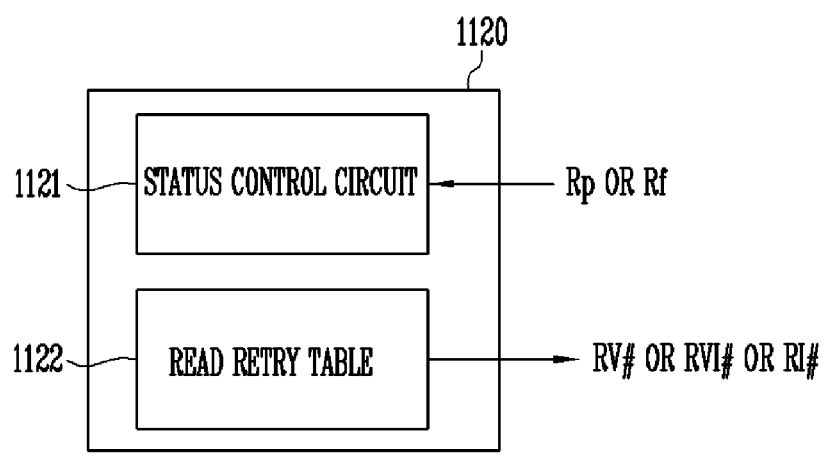
FIG. 2 is a diagram illustrating the memory controller of FIG. 1.

FIG. 2 is a diagram illustrating the memory controller of FIG. 1.

Referring to FIG. 2, the memory controller 1120 may include a status control circuit 1121 and a read retry table 1122 for a read retry operation.

The status control circuit 1121 may determine whether a read operation has passed or failed in response to a read pass signal Rp or a read fail signal Rf that is received from the memory device 1110, and output pas and fail (pass/fail) determination information to the read retry table 1122.

The read retry table 1122 may store codes RV#, RVI# or RI# required for a read operation, and output a selected code RV#,RVI# or RI# among the stored codes during the read retry operation. For example, the read retry table 1122 may store a plurality of read voltage codes RV#, codes RVI# that is formed by adding sensing current codes to read voltage codes, or sensing current codes RI#. The read retry table 1122 may store any one kind of codes or a plurality of kinds of codes among the read voltage codes RV#, the read voltage codes plus the sensing current codes RVI# and the sensing current codes RI#.

For example, if information received from the status control circuit 1121 during a read operation is pass information, the read retry table 1122 may store codes RV#, RVI# or RI# used for the passed read operation and output the corresponding codes RV#, RVI# or RI# as a default code during a subsequent read operation. Alternatively, if information received from the status control circuit 1121 during a read operation is fail information, the read retry table 1122 may output codes RV#, RVI# or RI# different from the preceding outputted codes among the stored codes RV#, RVI# or RI# to vary the conditions of the read operation.

Figure 3:
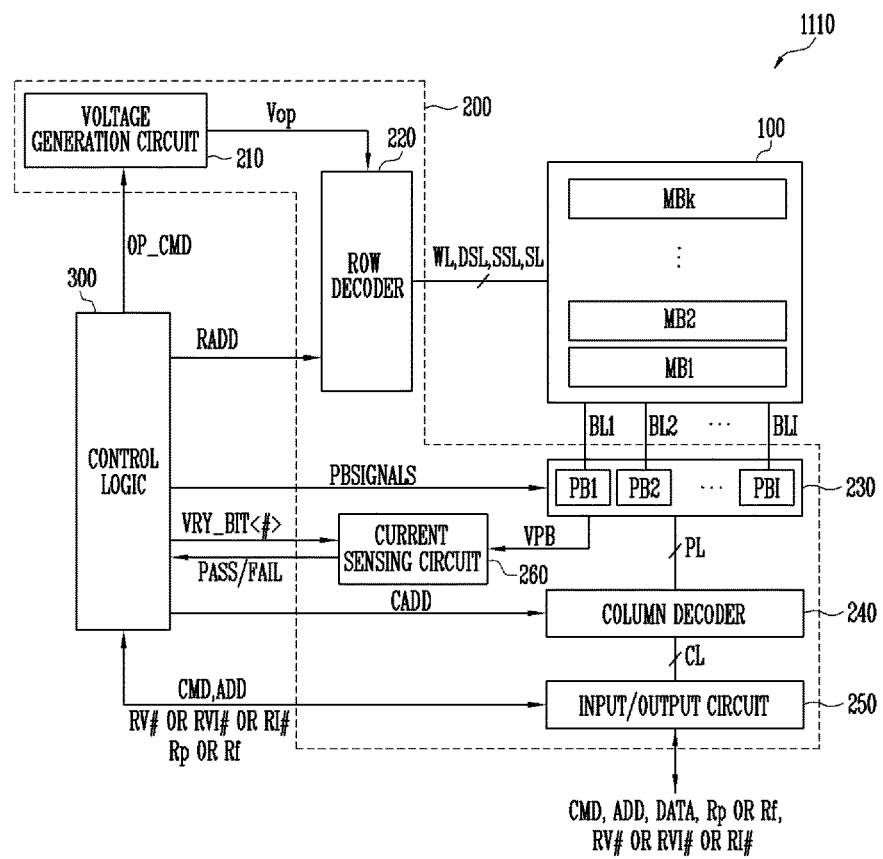
FIG. 3 is a diagram illustrating the memory device of FIG. 1.

FIG. 3 is a diagram illustrating the memory device of FIG. 1.

Referring to FIG. 3, the memory device 1110 may include a memory cell array 100 in which data is stored, a peripheral circuit 200 configured to perform a program operation for storing data in the memory cell array 100, a read operation for outputting the stored data, and an erase operation for erasing the stored data, and a control logic 300 for controlling the peripheral circuit 200.

The memory cell array 100 may include a plurality of memory blocks MB1 to MBk (k is a positive integer). The memory blocks MB1 to MBk may form a two-dimensional or three-dimensional structure. For example, a structure in which memory cells are horizontally arranged on a substrate is a two-dimensional structure, and a structure in which memory cells are vertically stacked on a substrate is a three-dimensional structure. Each of the memory blocks MB1 to MBk may be coupled to word lines WL, drain select lines DSL, source select lines SSL, and a source line SL and bit lines BL1 to BLl (l is a positive integer). The word lines WL, the drain select lines DSL and the source select lines SSL may be coupled to each of the memory blocks. The source line SL may be coupled in common to the memory blocks MB1 to MBk. The bit lines BL1 to BLl may also be coupled in common to the memory blocks MB1 to MBk.

The peripheral circuit 200 may include a voltage generation circuit 210, a row decoder 220, a page buffer group 230, a column decoder 240, an input and output (input/output) circuit 250, and a current sensing circuit 260.

The voltage generation circuit 210 may generate various operating voltages Vop to be used for a program, read, or erase operation in response to an operation signal OP_CMD. For example, the voltage generation circuit 210 may generate a program voltage, a read voltage, an erase voltage, a pass voltage, a turn-on voltage, and so forth. The voltage generation circuit 210 may selectively generate read voltages having various levels under the control of the control logic 300.

The row decoder 220 may deliver the operating voltages Vop to word lines WL, drain select lines DSL, source select lines SSL and the source line SL that are coupled to a selected memory block in response to a row address RADD.

The page buffer group 230 may include a plurality of page buffers PB1 to PBl coupled to the bit lines BL1 to BLl. The page buffers PB1 to PBl may operate in response to page buffer control signals PBSIGNALS. For example, the page buffers PB1 to PBl may temporarily store data received through the bit lines BL1 to BLl or sense voltages or currents of the bit lines BL1 to BLl during a read or verify operation.

The column decoder 240 may transmit data between the input/output circuit 250 and the page buffer group 230 in response to a column address CADD. For example, the column decoder 240 may exchange data with the page buffers PB through page lines PL or exchange data with the input/output circuit 250 through column lines CL.

The input/output circuit 250 may manage input/output of a command CMD, an address ADD and DATA of the memory device 1110. For example, the input/output circuit 250 may receive a command CMD and an address ADD from the memory controller (1120 of FIG. 2), and transmit them to the control logic 300 or exchange data DATA with the column decoder 240. During a read operation, the input/output circuit 250 may receive a read pass signal Rp or a read fail signal Rf from the control logic 300, and transmit it to the memory controller (1120 of FIG. 2). In addition, the input/output circuit 250 may receive read voltage codes RV#, read voltage codes plus sensing current codes RVI# or sensing current codes RI# from the memory controller (1120 of FIG. 2), and transmit them to the control logic 300.

During the read operation, the current sensing circuit 260 may generate a reference current in response to an allow bit VRY_BIT <#>, and may compare a sensing voltage VPB received from the page buffer group 230 with the reference current and output a pass signal PASS or a fail signal FAIL depending on a result of the comparison.

The control logic 300 may output an operation signal OP_CMD, a row address RADD, page buffer control signals PBSIGNALS, and an allow bit VRY_BIT <#> in response to a command CMD and an address ADD and thus control the peripheral circuit 200. In addition, the control logic 300 may determine whether a read operation of a selected page has passed or failed in response to a pass or fail signal PASS or FAIL during the read operation. For example, if the pass or fail signal PASS or FAIL is received, the control logic 300 may output a read pass signal Rp or a read fail signal Rf to the input/output circuit 250. In particular, the control logic 300 may output the operation signal OP_CMD to change the read voltage depending on the read voltage codes RV#, the read voltage codes plus sensing current codes RVI# or the sensing current codes RI# or output the page buffer control signals PBSIGNALS to change the sensing current. For example, the control logic 300 may control the peripheral circuit 200 such that a read retry operation is performed according to the received read voltage codes RV#, read voltage codes plus sensing current codes RVI# or sensing current codes RI#.

Figure 4:
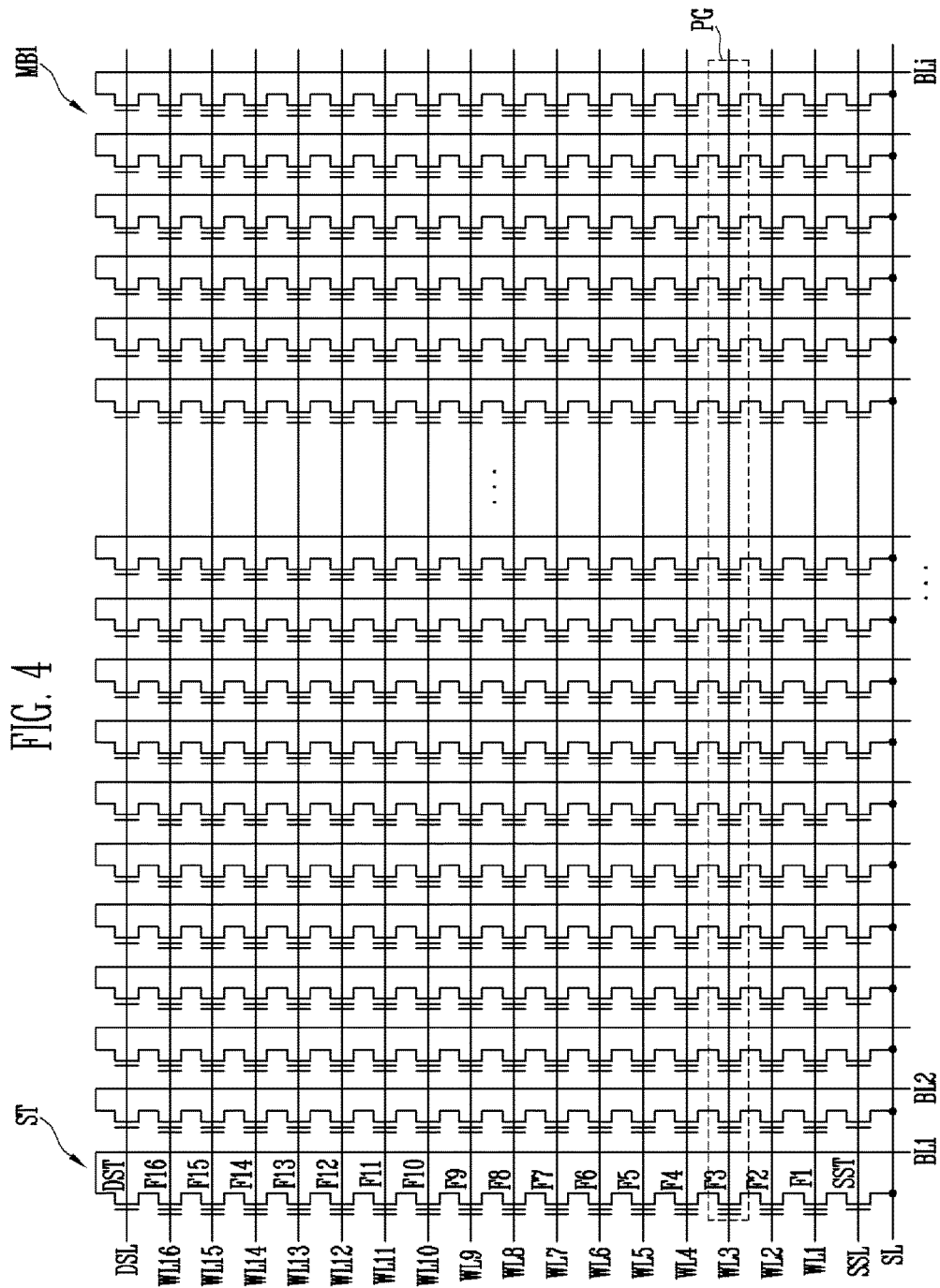
FIG. 4 is a diagram illustrating the memory block of FIG. 3.

FIG. 4 is a diagram illustrating the memory block of FIG. 3. Since the memory blocks (MB1 to MBk of FIG. 3) have the same or similar configuration, one memory block MB1 among them will be described as an example.

Referring to FIG. 4, the memory block MB1 may include a plurality of cell strings ST coupled between the bit lines BL1 to BLi (i is a positive integer) and the source line SL. The bit lines BL1 to BLi may be respectively coupled to the cell strings ST, and the source line SL may be coupled in common to the cell strings ST. The cell strings ST have the same configuration; therefore, a cell string ST coupled to the first bit line BL1 will be described as an example.

The cell string ST may include a source select transistor SST, a plurality of memory cells F1 to F16, and a drain select transistor DST which are coupled in series to each other between the source line SL and the first bit line BL1. The single cell string ST may include one or more source select transistors SST and drain select transistors DST. Furthermore, the number of memory cells included in the single cell string ST may be greater than the number of memory cells F1 to F16 illustrated in the drawing.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different cell strings ST may be coupled to the source select line SSL, gates of the drain select transistors DST may be coupled to the drain select line DSL, and gates of the memory cells F1 to F16 may be coupled to a plurality of word lines WL1 to WL16. Among the memory cells included in different cell strings ST, a group of memory cells coupled to the same word line is referred to as a page. Therefore, the number of pages PG included in the memory block may correspond to the number of word lines WL1 to WL16.

Figure 5:
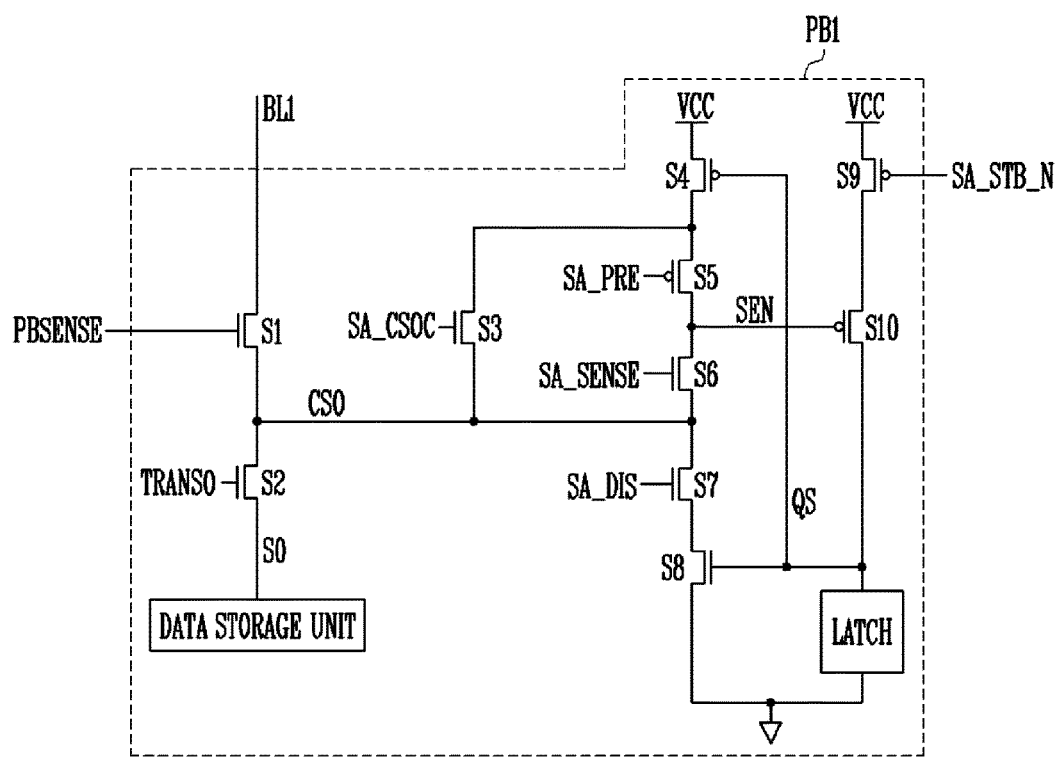
FIG. 5 is a diagram illustrating the page buffer of FIG. 3.

FIG. 5 is a diagram illustrating a page buffer of FIG. 3. Since the first to I-th page buffers PB1 to PBl described in FIG. 3 may have the same configuration, the first page buffer PB1 among them will be described with reference to FIG. 5.

Referring to FIG. 5, the first page buffer PB1 coupled to the bit line BL1 may include first to tenth switches S1 to S10. Signals PBSENSE, TRANSO, SA_CSOC, SA_PRE, SA_SENSE, SE_DIS and SA_STB_N for controlling the first to tenth switches S1 to S10 may be included in the page buffer control signals (PBSIGNALS of FIG. 3).

The first switch S1 may be embodied by an NMOS transistor that couples the first bit line BL1 to a first current sensing node CSO in response to a sensing signal PBSENSE. The second switch S2 may be embodied by an NMOS transistor that couples the first current sensing node CSO to a sensing node SO in response to a transmission signal TRANSO. The sensing node SO may be coupled to a data storage unit, and may be coupled to the current sensing circuit (260 of FIG. 3) during a sensing operation. During the sensing operation, a voltage applied to the sensing node SO may be transmitted to the current sensing circuit 260 as the sensing voltage (VPB of FIG. 3). For example, during a sensing operation, sensing nodes SO of the first to I-th page buffers PB1 to PBI may be coupled in common to the current sensing circuit 260. Here, a voltage that is transmitted from the first to I-th page buffers PB1 to PBI to the current sensing circuit 260 may be the sensing voltage VPB.

The third switch S3 may be embodied by an NMOS transistor that couples a node coupled between the fourth switch S4 and the fifth switch S5 to the first current sensing node CSO, in response to a precharge transmission signal SA_CSOC. The fourth switch S4 may be embodied by a PMOS transistor that couples a power supply terminal VCC to the fifth switch S5 depending on the potential of a data node QS. The data node QS may be changed depending on data stored in a latch, and be initialized to a low level. The fifth switch S5 may be embodied by a PMOS transistor that transmits a supply voltage transmitted through the fourth switch S4, to a second current sensing node SEN in response to a precharge signal SA_PRE. The sixth switch S6 may be embodied by an NMOS transistor that couples the second current sensing node SEN to the first current sensing node CSO in response to a sensing transmission signal SA_SENSE.

The seventh switch S7 may be embodied by an NMOS transistor that couples the first current sensing node CSO to the eighth switch S8 in response to a discharge signal SA_DIS. The eighth switch S8 may be embodied by an NMOS transistor that couples the seventh switch S7 to the ground terminal in response to the potential of the data node QS coupled to the latch.

The ninth switch S9 may be embodied by a PMOS transistor that couples the power supply terminal VCC to the tenth switch S10 in response to a strobe signal SA_STB_N. The tenth switch S10 may be embodied by a PMOS transistor that forms a current path between the ninth switch S9 and the latch in response to the potential of the second current sensing node SEN.

An operating method of the first page buffer PB1 during the read operation will be described below.

When the read operation starts, the ground voltage is applied to the source line (SL of FIG. 2), a read voltage is applied to a selected word line coupled to a selected memory block, and a pass voltage is applied to unselected word lines.

A precharge operation may be performed to precharge the first bit line BL1 to a positive voltage. During the precharge operation, data '0' may be stored in the latch. The data node QS may be initialized by data '0' to the low level. If the potential of the data node QS is in the low level, the fourth switch S4 may be turned on. When the third and first switches S3 and S1 are turned on in response to the precharge transmission signal SA_CSOC and the sensing signal PBSENSE, a current path may be formed through the fourth, third and first switches S4, S3 and S1. As a result, the first bit line BL1 may be coupled to the power supply terminal VCC, whereby the first bit line BL1 may be precharged to the positive voltage. Here, the ground voltage is applied to the source line (SL of FIG. 4) coupled to the selected memory block, and the drain and source select transistors DST and SST are maintained in the turned-on state.

An evaluation operation may start from a time point at which the first switch S1 is turned on by enabling the sensing signal PBSENSE. In the evaluation operation, current that flows through the first bit line BL1 may be maintained in the precharge state or increased depending on a threshold voltage of a memory cell coupled to the selected word line. For example, when the threshold voltage of the memory cell is higher than the read voltage, the memory cell is turned off, whereby the current that flows through the first bit line BL1 may be maintained in the precharge state. Alternatively, when the threshold voltage of the memory cell is lower than the read voltage, the memory cell is turned on, whereby the current that flows through the first bit line BL1 may be increased.

Thereafter, a sensing operation may be performed to sense the current that flows through the first bit line BL1. During the sensing operation, since the first and sixth switches S1 and S6 are in the turned-on state, the tenth switch S10 may be turned on or off depending on the potential of the second current sensing node SEN. For example, the potential of the second current sensing node SEN may be increased as the current that flows through the first bit line BL1 is reduced. The potential of the second current sensing node SEN may be reduced as the current that flows through the first bit line BL1 is increased. Therefore, the tenth switch S10 may be turned on when the current of the second current sensing node SEN is higher than a threshold current of the tenth switch S10. The tenth switch S10 may be turned off when the current of the second current sensing node SEN is lower than the threshold current of the tenth switch S10. The ninth switch S9 may be turned on when the strobe signal SA_STB_N is enabled to a low level. Consequently, a current path is generated between the power supply terminal VCC and the latch so that data may be stored in the latch. Here, the time for which the ninth switch S9 is maintained in the turned-on state may refer to a strobe time.

Figure 6:
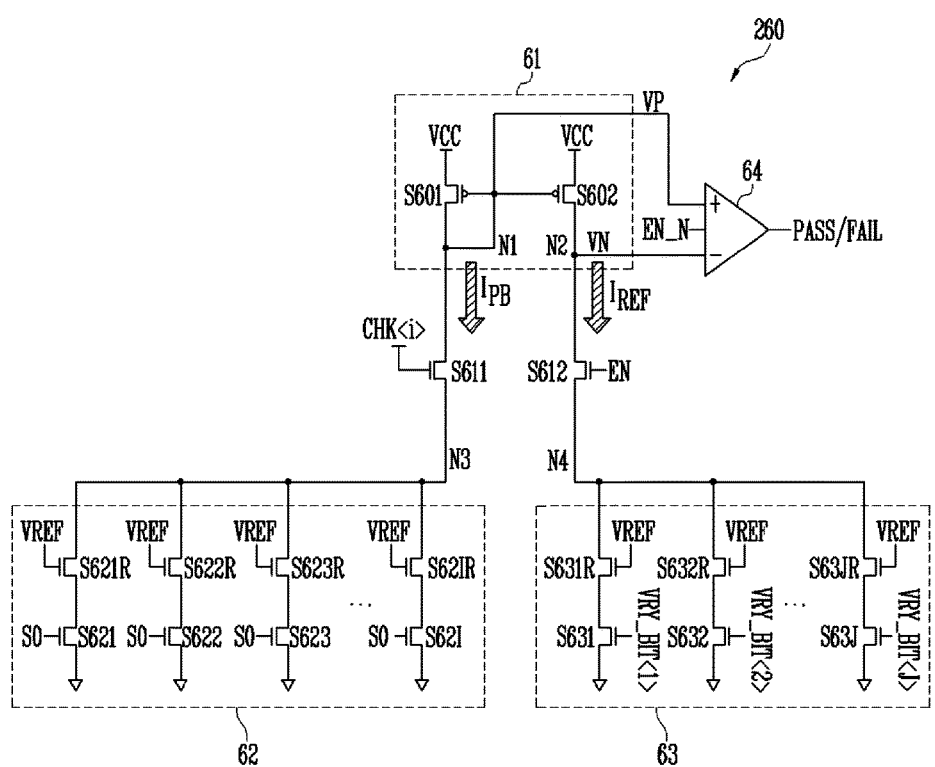
FIG. 6 is a diagram illustrating the current sensing circuit of FIG. 3.

FIG. 6 is a diagram illustrating the current sensing circuit of FIG. 3.

Referring to FIG. 6, the current sensing circuit 260 may output a pass signal PASS when the number of fail bits is less than the number of allow bits, and may output a fail signal FAIL when the number of fail bits is greater than the number of allow bits. The number of fail bits may be determined depending on the sensing voltages VPB received from the first to I-th page buffers (PB1 to PBI of FIG. 3), and the number of allow bits may be determined depending on the allow bit VRY_BIT <#> that is outputted from the control logic (300 of FIG. 3). For example, since a memory cell (hereinafter, referred to as a fail cell) having the threshold voltage lower than a target voltage corresponds to a fail cell, the number of fail bits is increased as the number of fail cells is increased. Therefore, the number of fail bits may be reduced as the number of program loops is increased. The number of allow bits may be maintained constant according to enable information set in the control logic 300.

The current sensing circuit 260 will be described below.

The current sensing circuit 260 may include a voltage generation unit 61, a chunk enable switch S611, an enable switch S612, a fail bit counter 62, an allow bit counter 63 and a comparator 64.

The voltage generation unit 61 may generate a pass voltage VP and a fail voltage VN depending on a fail bit current IPB and a reference current IREF. For example, the voltage generation unit 61 may generate a fail voltage VN higher than a pass voltage VP when the fail bit current IPB is increased, and generate a pass voltage VP higher than a fail voltage VN when the fail bit current IPB is reduced. For this, the voltage generation unit 61 may include first and second switches S601 and S602. The first switch S601 may be coupled between a terminal, to which the power supply voltage VCC is applied, and a first node N1, and embodied by a PMOS transistor which is turned on or off in response to a voltage of the first node N1.

The second switch S602 may be coupled between the terminal, to which power supply voltage VCC is applied, and a second node N2, and embodied by a PMOS transistor which is turned on or off in response to a voltage of the second node N2. The current that flows through the first node N1 becomes the fail bit current IPB, and the associated voltage becomes the pass voltage VP. The current that flows through the second node N2 becomes the reference current IREF, and the associated voltage becomes the fail voltage VN. Therefore, if the fail bit current IPB is increased, the pass voltage VP is reduced, and if the fail bit current IPB is reduced, the pass voltage VP is increased. In addition, if the reference current IREF is increased, the fail voltage VN is reduced, and if the reference current IREF is reduced, the fail voltage VN is increased.

The chunk enable switch S611 may be coupled between the first node N1 and a third node N3, and embodied by an NMOS transistor which is turned on or off in response to a chunk voltage CHK <i> that is a voltage of internal nodes of the page buffers divided on a chunk basis.

The enable switch S612 may be coupled between the second node N2 and a fourth node N4, and embodied by an NMOS transistor which is turned on or off in response to an enable signal EN for a pass/fail determination operation.

The fail bit counter 62 may be configured to change current of the third node N3 depending on the sensing voltage VPB that is transmitted through the sensing nodes SO of the page buffers. For example, the fail bit counter 62 may include a plurality of fail bit reference switches S621R to S62IR and a plurality of fail bit switches S621 to S62I. The fail bit reference switches S621R to S62IR may be respectively paired with the fail bit switches S621 to S62I and coupled in parallel to the third node N3. For example, the first fail bit reference switch S621R and the first fail bit switch S621 may be coupled in series between the third node N3 and the ground terminal. In such a way, the I-th fail bit reference switch S62IR and the I-th fail bit switch S62I may be coupled in series between the third node N3 and the ground terminal.

The plurality of fail bit reference switches S621R to S62IR may be respectively embodied by NMOS transistors which are turned on or off in common in response to a reference voltage VREF. Gates of the plurality of fail bit switches S621 to S62I may be respectively coupled to the sensing nodes SO of the page buffers. Since the voltage of each sensing node SO has been defined as the sensing voltage VPB, the fail bit may refer to a high sensing voltage. The plurality of fail bit switches S621 to S62I may be respectively embodied by NMOS transistors which are turned on when high voltages are applied to the gates. Therefore, the larger the number of fail bits, the larger the number of fail bit switches S621 to S62I to be turned on. If the number of turned-on fail bit switches S621 to S62I is increased, current that flows through the third node N3 may also be increased.

The allow bit counter 63 may be configured to maintain the current of the fourth node N4 constant according to the set allow bit VRY_BIT <#>. That is, the current of the fourth node N4 is changed depending on the allow bit VRY_BIT <#>. However, because the allow bit VRY_BIT <#> is maintained at a constant, the current that flows through the fourth node N4 may be maintained constantly. The allow bit VRY_BIT <#> may be set to vary depending on the memory device, taking ECC (error correction code) capacity, etc. into account.

The allow bit counter 63 may include a plurality of allow bit reference switches S631R to S633R and a plurality of allow bit switches S631 to S633. The allow bit reference switches S631R to S6JR may be respectively paired with the allow bit switches S631 to S633 and coupled in parallel to the fourth node N4. For example, a first allow bit reference switch S631R and a first allow bit switch S631 may be coupled in series between the fourth node N4 and the ground terminal. In such a way, a J-th allow bit reference switch S633R and a J-th allow bit switch S633 may be coupled in series between the fourth node N4 and the ground terminal. The plurality of allow bit reference switches S631R to S633R may be respectively embodied by NMOS transistors which are turned on or off in common in response to the reference voltage VREF. Gates of the plurality of allow bit switches S631 to S633 may be respectively embodied by NMOS transistors which are turned on or off in response to allow bits VRY_BIT <J:1> that are outputted from the control logic 300. Therefore, the number of allow bit switches S631 to S633 to be turned on may be increased as the number of allow bits is increased. If the number of turned-on allow bit switches S631 to S633 is increased, current that flows through the fourth node N4 may also be increased.

As described above, the current of the fourth node N4 is maintained constant according to the allow bits VRY_BIT <J:1>. However, the current of the third node N3 is changed depending on fail bits of each program loop. Therefore, if both the chunk enable switch S611 and the enable switch S612 are turned on, the fail bit current IPB and the pass voltage VP are generated depending on the current of the third node N3, and the reference current IREF and the fail voltage VN are generated depending on the current of the fourth node N4.

The comparator 64 compares the pass voltage VP with the fail voltage VN in response to an enable inverted signal EN_N, and outputs a pass signal PASS or a fail signal FAIL depending on the result of the comparison. For example, the pass voltage VP may be applied to a plus (+) terminal of the comparator 64, and the fail voltage VN may be applied to a minus (−) terminal thereof. Therefore, the comparator 64 outputs the pass signal PASS when the pass voltage VP is higher than the fail voltage VN, and outputs the fail signal FAIL when the fail voltage VN is higher than the pass voltage VP. The control logic 300 may receive the pass signal PASS or the fail signal FAIL, and control the peripheral circuit (200 of FIG. 3) to perform a subsequent operation.

Figure 7:
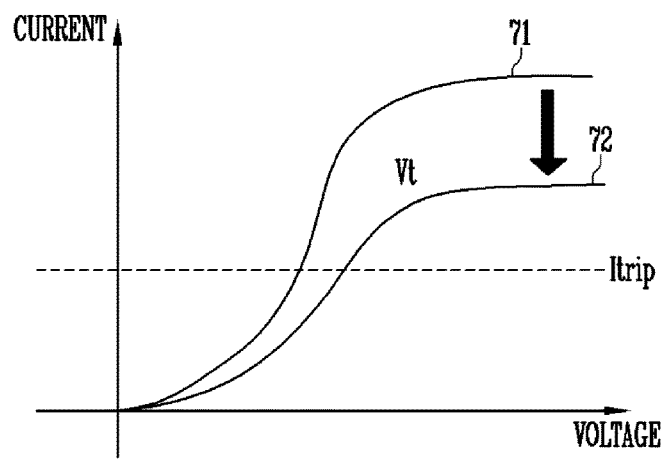
FIG. 7 is a diagram illustrating the current of memory cells.

FIG. 7 is a diagram illustrating the current of memory cells.

Referring to FIG. 7, as voltages that are applied to word lines are increased, the current that flows through the corresponding memory cells is increased. However, if a voltage applied to each of the word lines is a predetermined level or more, the current that flows through the corresponding memory cell may be maintained at a constant. During a read operation, a threshold voltage Vt of the memory cells may be determined according to a sensing current Itrip. For example, when a read voltage is applied to a selected word line, if the current that flows through the corresponding memory cell is lower than the sensing current Itrip, this means that the threshold voltage of the memory cell is higher than the read voltage. The words "the threshold voltage of the memory cell is higher than the read voltage" means that the memory cell is in a programmed state. Therefore, in the read operation of the current sensing method, the sensing current Itrip may be a reference of the read operation.

However, as the program and erase operations of the memory cells are repeated, that is, as the number of cycling is increased, the memory cells may deteriorate. Consequently, the current that flows through the memory cells may be gradually reduced, as shown by reference numerals 71 and 72. Therefore, during a read retry operation in which a read operation is performed again with changed read operation conditions when the read operation fails, there is the need for adjusting the sensing current Itrip.

Figure 8:
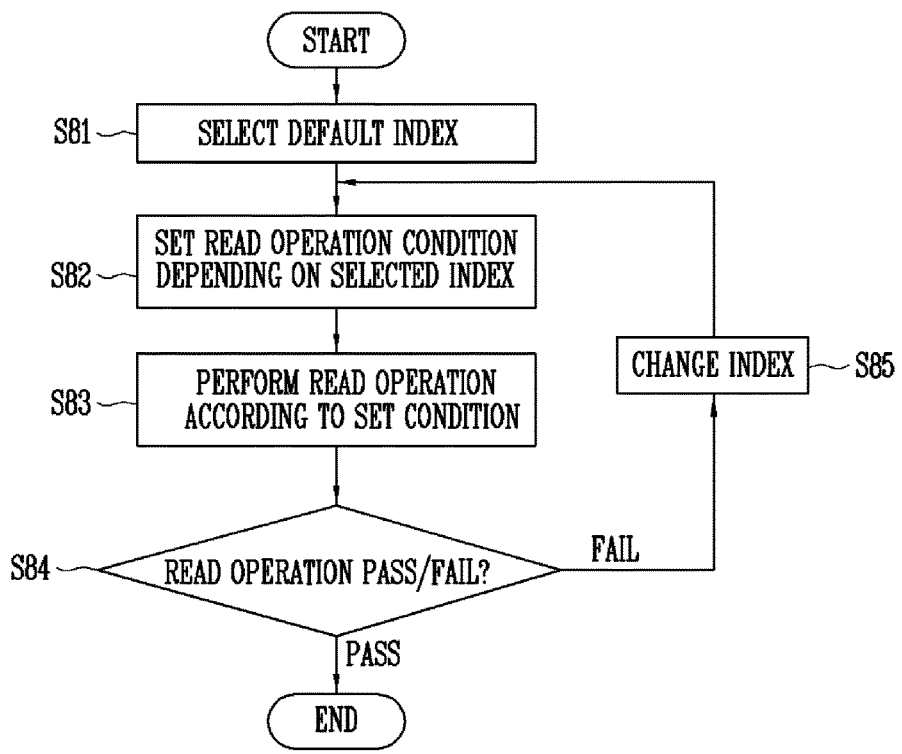
FIG. 8 is a flowchart illustrating a read operation according to an embodiment of the present disclosure.

FIG. 8 is a flowchart illustrating a read operation according to an embodiment of the present disclosure.

Referring to FIG. 8, if a read operation starts, the memory controller (1120 of FIG. 2) selects a default index among a plurality of codes stored in the read retry table (1122 of FIG. 2), at step S81. For example, a plurality of codes which may change the conditions of the read operation may correspond to each of the indexes. A default code may be selected when the read operation is first performed.

The memory controller (1120 of FIG. 2) may transmit codes corresponding to a selected index to the memory device (1110 of FIG. 1), and the memory device (1110 of FIG. 3) may set the conditions of the read operation according to received codes, at step S82. For example, the memory device (1110 of FIG. 3) may set, according to the received codes, a read voltage or sensing current to be used for the read operation, or set both the read voltage and the sensing current.

The memory device (1110 of FIG. 3) may perform the read operation according to the set conditions, at step S83. For example, if the read voltage, the sensing current, and the like are set, the memory device (1110 of FIG. 3) may perform a read operation for memory cells included in a selected page of a selected memory block.

The memory device (1110 of FIG. 3) may determine whether the read operation for the selected page has passed or failed. For example, if the number of error bits of read data is less than a threshold number of bits, the read operation may pass. If the read operation has passed, the memory device (1110 of FIG. 3) may transmit the read pass signal (Rp of FIG. 2) to the memory controller (1120 of FIG. 2), and the memory controller (1120 of FIG. 2) may complete the read operation. However, if the number of error bits is greater than the threshold number of bits, the read operation may fail, and the memory device (1110 of FIG. 3) may transmit the read fail signal (Rf of FIG. 2) to the memory controller (1120 of FIG. 2). The memory controller (1120 of FIG. 2) may change the index, at step S85, and output the changed index to the memory device (1110 of FIG. 3). The memory device (1110 of FIG. 3) may reset the conditions of read operation according to the changed index, at step S82, and perform a read retry operation. That is, steps S82 to S85 may be repeated until the read operation passes. While steps S82 to S85 are repeated, the read voltage or sensing current may be changed.

During the above-described operation, the index may be stored as various codes in the read retry table (1122 of FIG. 2). Detailed description of the index is as follows.

Figure 9:
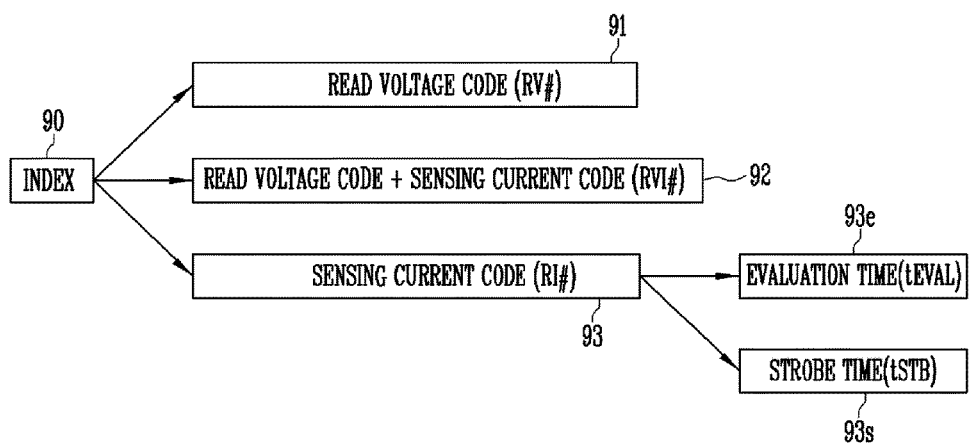
FIG. 9 is a diagram illustrating an index which may be stored in a read retry table.

FIG. 9 is a diagram illustrating an index which may be stored in the read retry table.

Referring to FIG. 9, an index 90 may include read voltage codes RV#; 91 that are used for a read operation, codes RVI#; 92 that are formed by including sensing current codes in the read voltage codes, or the sensing current codes RI#; 93. That is, the read voltage codes 91 may be stored in the read retry table, the read voltage codes plus (+) sensing current codes 92 may be stored therein, or only the sensing current codes 93 may be stored therein. There are various factors changing the sensing current. For example, the sensing current may be changed depending on an evaluation time tEVAL and a strobe time tSTB. The evaluation time tEVAL refers to a time for which the current of bit lines is changed depending on the threshold voltage of memory cells during a read operation. The strobe time tSTB refers to a time for which data are stored in the latch according to the current of bit lines after the evaluation time. Therefore, in the case where the sensing current codes are included in the index 90, codes for the evaluation time tEVAL (93e) or the strobe time tSTB (93s) may be included, or all codes for the evaluation time tEVAL (93e) and the strobe time tSTB (93s) may be included.

In addition, the sensing current may be changed by various other conditions as well as the above-described evaluation time tEVAL and strobe time tSTB. For example, during a read operation or a read retry operation, the sensing current may be changed depending on the level of a precharge voltage that is supplied to the first current sensing node CSO. In this case, a precharge voltage code may be included in the index 90.

Figure 10:
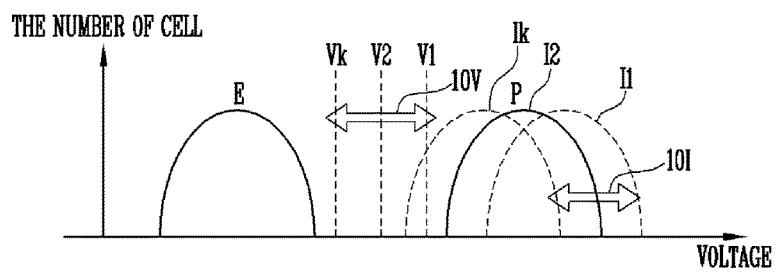
FIG. 10 is a diagram illustrating a read retry operation according to an embodiment of the present disclosure.

FIG. 10 is a diagram illustrating a read retry operation according to an embodiment of the present disclosure, and FIGS. 11 to 13 are diagrams illustrating indexes according to the read retry table.

Referring to FIG. 10, each of the memory cells may be formed of a single level cell (SLCs) capable of storing one bit of data. In this case, the memory cells may include one erase threshold voltage distribution E or one program threshold distribution P. In the case where a read operation has failed, the read retry operation may be performed while the read voltage (one of V1 to Vk) may be changed, as illustrated by reference numeral 10y, or the sensing current (one of I1 to Ik) may be changed, as illustrated by reference numeral 10I.

FIG. 11 is a diagram illustrating first embodiments of the read retry table that is used for the read retry operation described with reference to FIG. 10.

Referring to FIG. 11, a plurality of read voltage codes RV# may be stored in the read retry table, and a read voltage code (any one of RV1 to RVk) corresponding to a selected index ID may be selected. A read voltage (one of V1 to Vk) may be generated by a selected read voltage code (any one of RV1 to RVk), and the corresponding read voltage may be used during a read retry operation. For example, if a first index ID1 is selected, a first read voltage code RV1 corresponding to the first index ID1 may be selected, and a first read voltage V1 corresponding to the first read voltage code RV1 may be generated.

FIG. 12 is a diagram illustrating second embodiments of the read retry table that is used for the read retry operation described with reference to FIG. 10.

Referring to FIG. 12, a plurality of read voltage codes plus (+) sensing current codes RVI# may be stored in the read retry table, and a read voltage code+sensing current code (any one of RVI1 to RVIk) corresponding to a selected index ID may be selected. A read voltage (one of V1 to Vk) may be changed depending on a read voltage code included in a selected read voltage code+sensing current code (any one of RVI1 to RVIk), and sensing current (one of I1 to Ik) may be changed depending on a sensing current code included in the selected read voltage code+sensing current code (any one of RVI1 to RVIk). The read retry operation may be performed in such a way that, if the sensing current (I1 to Ik) is changed, the threshold voltage of memory cells is changed. For example, if a first index ID1 is selected, a first read voltage code+sensing current code RVI1 corresponding to the first index ID1 may be selected, and a first read voltage V1 and first sensing current I1 corresponding to the first read voltage code+sensing current code RVI1 may be generated.

FIG. 13 is a diagram illustrating third embodiments of the read retry table that is used for the read retry operation described with reference to FIG. 10.

Referring to FIG. 13, a plurality of sensing current codes RI# may be stored in the read retry table, and a sensing current code (any one of RI1 to RIk) corresponding to a selected index ID may be selected. The sensing current (I1 to Ik) may be set by a selected sensing current code (any one of RI1 to RIk), and the corresponding sensing current may be set during a read retry operation. For example, if a first index ID1 is selected, a first sensing current code RI1 corresponding to the first index ID1 may be selected, and first sensing current I1 corresponding to the first sensing current code RI1 may be set. As illustrated in FIG. 13, in the case where only the sensing current codes (RI1 to RIk) are stored in the read retry table, the read retry operation may be performed in such a way that the read voltage is set as a default and fixed, and only the sensing current is changed.

Figures 14, 15:
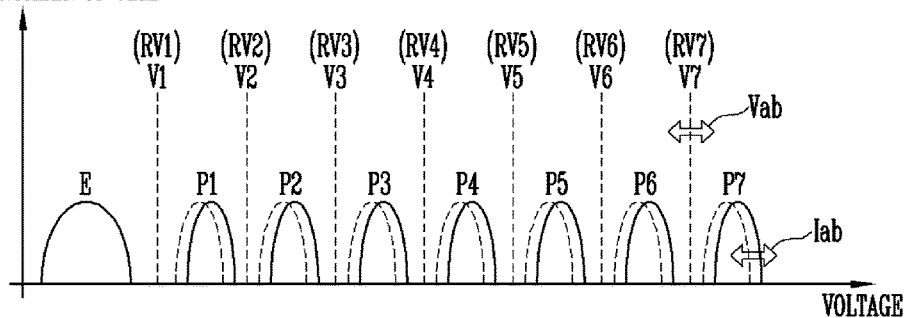
FIG. 14 is a diagram illustrating a read retry operation according to an embodiment of the present disclosure.
FIG. 15 is a diagram illustrating first embodiments of the read retry table that is used for the read retry operation described with reference to FIG. 14.

FIG. 14 is a diagram illustrating a read retry operation according to an embodiment of the present disclosure, and FIGS. 15 to 17 are diagrams illustrating indexes according to a read retry table.

Referring to FIG. 14, each of the memory cells may be formed of a multi-level cell (MLC), triple-level cell (TLC) or quadruple-level cell (QLC) capable of storing two or more bits of data. For example, the multi-level cells (MLCs) are configured such that two bits of data are stored in each memory cell. The triple-level cells (TLCs) are configured such that three bits of data are stored in each memory cell. The quadruple-level cells (QLCs) are configured such that four bits of data are stored in each memory cell. Although the triple-level cells (TLCs) will be described by way of example, the following description may be applied to any memory device including the other multi-level cells (MLCs) such as the quadruple-level cells (QLCs), etc. capable of storing two or more bits of data in each memory cell.

In the case of triple level cells (TLCs), the memory cells may include one erase threshold voltage distribution E and seven program threshold voltage distributions P1 to P7. Therefore, in the case where a read operation has failed, a read retry operation may be performed while read voltages V1 to V7 are changed, as illustrated by reference character Vab, or sensing currents are changed, as illustrated by reference character Iab, to divide the threshold voltage distributions P1 to P7 from each other. For example, a fourth read voltage V4 may be used to divide memory cells having a threshold voltage lower than the fourth read voltage V4 from memory cells having a threshold voltage higher than the fourth read voltage V4, and be changed depending on read voltage codes during a read retry operation. In addition, during the read retry operation, the read voltage codes and the sensing current codes may be differently changed depending on the threshold voltage distribution of memory cells. For example, the read voltage codes or sensing current codes may be selected differently between during a read retry operation in which memory cells having a low threshold voltage and memory cells having a high threshold voltage are divided from each other based on a second read voltage V2, and during a read retry operation in which memory cells having a low threshold voltage and memory cells having a high threshold voltage are divided from each other based on a sixth read voltage V6.

FIG. 15 is a diagram illustrating first embodiments of the read retry table that is used for the read retry operation described with reference to FIG. 14.

Referring to FIG. 15, a plurality of read voltage codes (RV11 to RVa7; a is a positive integer) may be stored in the read retry table. For example, various read voltage codes RV11 to RVa7 corresponding to the respective first to seventh read voltages V1 to V7 may be stored in the read retry table. For example, with regard to the first read voltage V1, various read voltage codes (RV11, RV21, RV31, . . . , RVa1) corresponding to the first read voltage V1 may be stored in the read retry table. In this way, the plurality of read voltage codes RV12 to RVa7 corresponding to the respective second to seventh read voltages V2 to V7 may be stored in the read retry table. The read voltage codes RV11 to RVa7 stored in the read retry table may be selected depending on indexes ID1*b* to IDab. For example, if a twelfth index ID12 is selected, a twelfth read voltage code RV12 corresponding thereto may be selected, and if a thirty-sixth index ID36 is selected, a thirty-sixth read voltage code RV36 corresponding thereto may be selected. As described above, in the case where only the read voltage codes RV11 to RVa7 are stored in the read retry table, during a read retry operation, read voltages are changed, and sensing current is maintained at a value set as a default.

FIG. 16 is a diagram illustrating second embodiments of the read retry table that is used for the read retry operation described with reference to FIG. 14.

Referring to FIG. 16, a plurality of read voltage codes plus (+) sensing current codes (RVI11 to RVIa7) may be stored in the read retry table. For example, the read voltage codes+sensing current codes RVI11 to RVIa7, including various read voltage codes corresponding to the respective first to seventh read voltage V1 to V7, and sensing current codes according to the respective read voltages or threshold voltage distributions, may be stored in the read retry table. For example, with regard to the first read voltage V1, a plurality of read voltage codes and a plurality of sensing current codes (RVI11, RVI21, RVI31, . . . , RVIa1) corresponding to the first read voltage V1 may be stored in the read retry table. In this way, the plurality of read voltage codes and sensing current codes RVI12 to RVIa7 corresponding to the respective second to seventh read voltages V2 to V7 may be stored in the read retry table. The read voltage codes and sensing current codes RVI11 to RVIa7 stored in the read retry table may be selected depending on indexes ID1*b* to IDab. For example, if a twelfth index ID12 is selected, a twelfth read voltage code and sensing current code RVI12 corresponding thereto may be selected, and if a thirty-sixth index ID36 is selected, a thirty-sixth read voltage code and sensing current code RVI36 corresponding thereto may be selected. As described above, in the case where the read voltage codes and sensing current codes RVI11 to RVIa7 are stored in the read retry table, both the read voltages and sensing current may be changed during a read retry operation.

FIG. 17 is a diagram illustrating third embodiments of the read retry table that is used for the read retry operation described with reference to FIG. 14.

Referring to FIG. 17, a plurality of sensing current codes (RI11 to RIa7; a is a positive integer) may be stored in the read retry table. For example, various sensing current codes RI11 to RIa7 corresponding to the respective first to seventh read voltages V1 to V7 may be stored in the read retry table. For example, with regard to the first read voltage V1, various sensing current codes (RI11, RI21, RI31, . . . , RIa1) corresponding to the first read voltage V1 may be stored in the read retry table. In this way, the plurality of sensing current codes RI12 to RIa7 corresponding to the respective second to seventh read voltages V2 to V7 may be stored in the read retry table. The sensing current codes RI11 to RIa7 stored in the read retry table may be selected depending on indexes ID1b to IDab. For example, if a twelfth index ID12 is selected, a twelfth sensing current code RI12 corresponding thereto may be selected, and if a thirty-sixth index ID36 is selected, a thirty-sixth sensing current code RI36 corresponding thereto may be selected. As described above, in the case where only the sensing current codes RI11 to RIa7 are stored in the read retry table, a read retry operation may be performed using the first to seventh read voltages set as defaults and the sensing currents that may be changed.

The evaluation time or strobe time may be changed to change sensing currents, and detailed description thereof is as follows.

Figure 18:
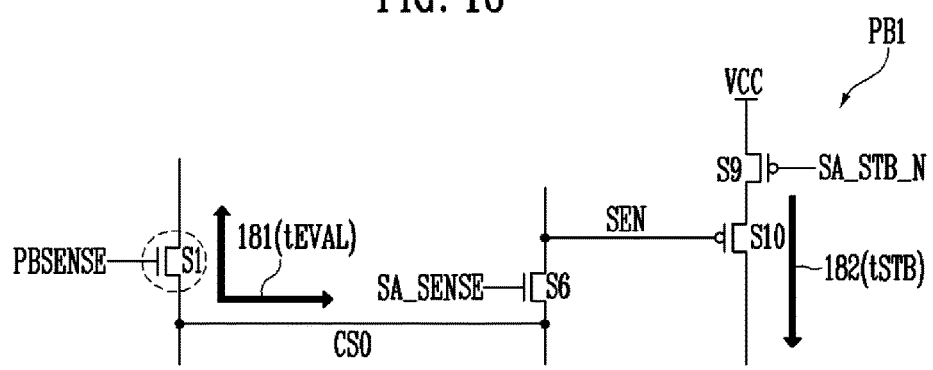
FIG. 18 illustrates a portion of a page buffer to describe a method of changing sensing current.

FIG. 18 illustrates a portion of a page buffer to describe a method of changing sensing current.

Referring to FIG. 18, there is illustrated a portion of the page buffer PB1 described with reference to FIG. 5. The evaluation time tEVAL refers to a time for which a threshold voltage of a memory cell is reflected to a bit line BL1. For example, when a read voltage is applied to a selected word line, if a precharge voltage is supplied to the first current sensing node CSO and the first switch S1 is turned on, current that flows through the bit line BL1 may be maintained or changed depending on the threshold voltage of the memory cell. If the first and sixth switches S1 and S6 are turned on, a current 181 that flows through the bit line BL1 may also flow through the first current sensing node CSO and the second current sensing node SEN.

The strobe time tSTB refers to a time for which a strobe signal SA_STB_N that turns on the ninth switch S9 is enabled. For example, when the strobe signal SA_STB_N becomes a low level, the strobe signal SA_STB_N is enabled. Here, the tenth switch S10 may be turned on or off depending on current of the second current sensing node SEN. If the ninth switch S9 and the tenth switch S10 are turned on, a current 182 may flow between the power supply terminal VCC and the data node QS.

Figure 19:
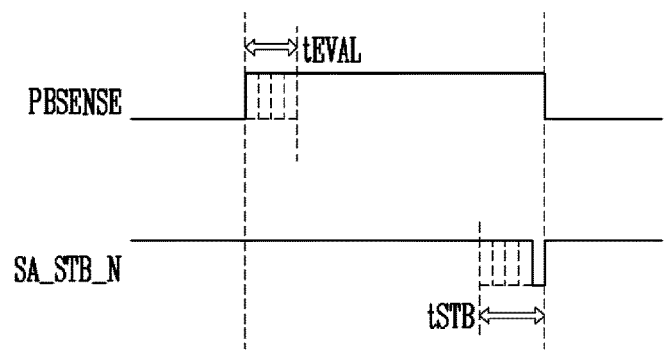
FIG. 19 is a timing diagram for describing a method of changing sensing current.

FIG. 19 is a timing diagram for describing a method of changing sensing current.

Referring to FIG. 19, during a read operation, the evaluation time tEVAL may be adjusted by changing a time for which the sensing signal PBSENSE makes a transition from a low level to a high level. The strobe time tSTB may be adjusted by changing a time for which the strobe signal SA_STB_N makes a transition from a high level to a low level.

Furthermore, as described with reference to FIG. 9, sensing current may be changed depending on the precharge voltage as well as the evaluation time tEVAL and the strobe time tSTB. For example, during a precharge operation of the first current sensing node CSO for a read operation or read retry operation, the sensing current may be adjusted depending on the level of the precharge voltage that is supplied to the first current sensing node CSO. As the level of the precharge voltage is reduced, the current of the first current sensing node CSO may be reduced. Therefore, the sensing current may be adjusted using these characteristics.

As described above, the read operation of the memory system is performed in such a way that the sensing current is changed depending on the threshold voltages of memory cells. Thereby, the reliability of the memory system may be improved.

Figure 20:
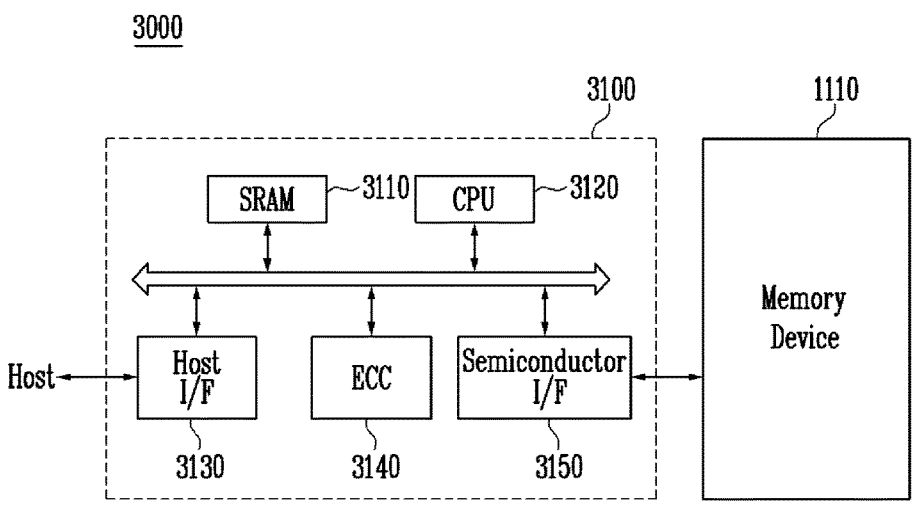
FIG. 20 is a block diagram illustrating a memory system including a memory device according to an embodiment of the present disclosure.

FIG. 20 is a block diagram illustrating a memory system including the memory device according to the embodiments of the present disclosure. A memory device 1110 may have the substantially same configuration as that of FIG. 3; therefore, a detailed description of the memory device 1110 will be omitted.

Referring to FIG. 20, the memory system 3000 may include a control unit 3100 and a memory device 1110. The control unit 3100 may be configured to control the memory device 1110. The control unit 3100 may be configured in various ways as follows, and besides may have the configuration described with reference to FIG. 3. An SRAM 3110 may be used as a working memory of a CPU 3120. A host interface (3130; Host I/F) includes a data exchange protocol of a host coupled to the memory system 3000. An error correction circuit (ECC) 3140 provided in the control unit 3100 may detect and correct an error included in data read from the memory device 1110. A semiconductor interface (3150; Semiconductor I/F) may be configured to interface with the memory device 1110. The CPU 3120 may perform control operations for data exchange of the controller 3100. Although not illustrated in FIG. 20, the memory system 3000 may further include a ROM (not illustrated) for storing code data to interface with the host.

The memory system 3000 according to the present embodiments may be applied to a device such as a computer, a ultra mobile PC (UMPC), workstation, net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting/receiving information in an wireless environment, one of various devices for forming a home network, or the like.

Figure 21:
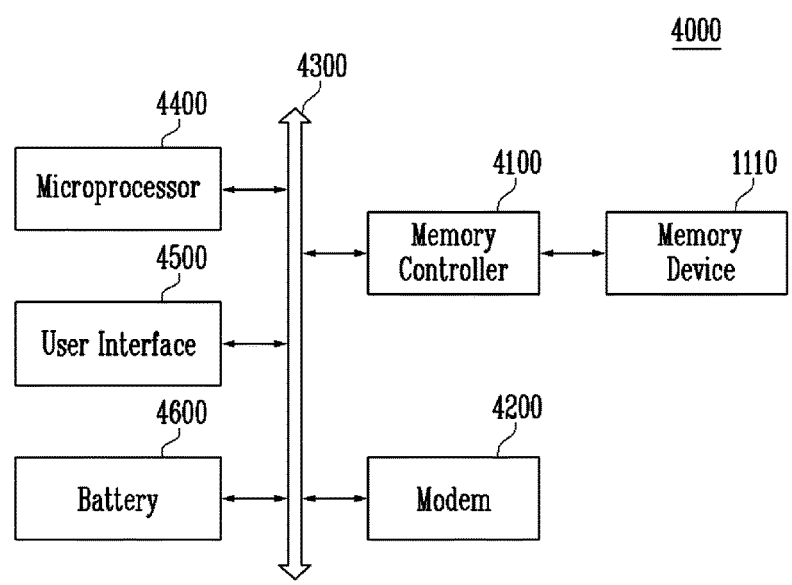
FIG. 21 is a diagram illustrating a computing system including the memory device according to the embodiments of the present disclosure.

FIG. 21 is a diagram illustrating a computing system including the memory device according to the embodiments of the present disclosure. In an embodiment, a memory device 1110 may have the substantially same configuration as that of FIG. 3; therefore, a description of the memory device 1110 will be omitted.

Referring to FIG. 21, a computing system 4000 may include a memory device 1110, a memory controller 4100, a modem 4200, a microprocessor 4400 and a user interface 4500 which are electrically coupled to a bus 4300. If the computing system 4000 according to a present embodiment is a mobile device, an additional battery 4600 may be provided to supply an operating voltage of the computing system 4000. Although not illustrated in the drawing, the computing system 4000 according to a present embodiment may further include an application chip set, a camera image processor (CIS), a mobile DRAM, or the like.

The memory controller 4100 and the memory device 1110 may form a solid state drive/disk (SSD).

The system according to a present embodiment may be mounted using packages of various forms. For example, the system may be mounted using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

According to the present disclosure, a read operation of the memory system is performed in such a way that sensing current is changed depending on threshold voltages of memory cells. Thereby, the reliability of the memory system may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
   a memory controller configured to include a read retry table including a plurality of evaluation time codes and to output a selected code among the plurality of evaluation time codes during a read retry operation; and
   a memory device configured to perform the read retry operation according to the selected code received from the memory controller, and
   wherein the plurality of evaluation time codes determine read data acquired from the read retry operation by changing a sensing current flowing through a memory cell.

2. The memory system according to claim 1, wherein the plurality of evaluation time codes comprise codes to set currents that function as references for determining, during the read retry operation, whether selected memory cells have been programmed or erased.

3. The memory system according to claim 1, wherein the memory controller further comprises:
   a status control circuit configured to determine whether a read operation performed in the memory device has passed or failed depending on a read pass signal or a read fail signal received from the memory device, and output pass and fail (pass/fail) determination information to the read retry table.

4. The memory system according to claim 1, wherein in the read retry table, only the plurality of evaluation time codes are stored, or the plurality of evaluation time codes and a plurality of read voltage codes are stored together.

5. The memory system according to claim 4, wherein when only the plurality of evaluation time codes are stored in the read retry table,
   the memory controller outputs a selected code among the plurality of evaluation time codes to the memory device, and
   the memory device sets a sensing current of the read retry operation depending on the selected code.

6. The memory system according to claim 4, wherein when the plurality of evaluation time codes and the plurality of read voltage codes are stored together in the read retry table,
   the memory controller outputs a selected read voltage code and a selected evaluation time code among the plurality of read voltage codes and the plurality of evaluation time codes to the memory device, and
   the memory device sets a read voltage and a sensing current of the read retry operation depending on the selected read voltage code and the selected evaluation time code.

7. The memory system according to claim 1, wherein the evaluation time codes are stored as various codes depending on a read voltage and a threshold voltage distribution of memory cells.

8. The memory system according to claim 4, wherein in the read retry table, precharge voltage codes for changing a precharge voltage that is supplied to a sensing node of the memory device are further included.

9. The memory system according to claim 1, wherein when it is determined that the read retry operation has passed, the memory controller stores the selected code used for the passed read retry operation, and outputs the selected code as a default code during a subsequent read retry operation.

10. An operating method of a memory system comprising:
    performing a read retry operation of selected memory cells according to a default code; and
    changing, after the read retry operation has failed, a sensing current depending on a plurality of evaluation time codes stored in a read retry table, and repeating the read retry operation until the read retry operation passes,
    wherein the plurality of evaluation time codes determine read data acquired from the read retry operation by changing the sensing current flowing through a memory cell.

11. The operating method according to claim 10, wherein the performing of the read retry operation of the selected memory cells according to the default code comprises:
    setting conditions of the read retry operation depending on the default code;
    performing the read retry operation according to the set conditions; and
    determining whether the read retry operation has passed or failed.

12. The operating method according to claim 10, further comprising:
    storing, when the read retry operation has passed, the evaluation time code among the plurality of evaluation time codes used for the passed read retry operation.

13. The operating method according to claim 10, wherein the repeating of the read retry operation comprises:
    selecting, when the read retry operation has failed, a code different from the preceding used code among the plurality of evaluation time codes stored in the read retry table;
    setting a sensing current depending on the selected evaluation time code;
    reading memory cells included in the selected memory cells based on the set sensing current; and
    determining whether the read retry operation has passed or failed.

14. The operating method according to claim 13, wherein the evaluation time codes comprise a code for adjusting an evaluation time of the read retry operation or adjusting a strobe time, or a code for adjusting both the evaluation time and the strobe time.

15. The operating method according to claim 14, wherein the evaluation time comprises a time for which current of bit lines is changed depending on a threshold voltage of the selected memory cells during the read retry operation.

16. The operating method according to claim 14, wherein the strobe time comprises a time for which data changed depending on the current of the bit lines during the read retry operation is stored.

17. The operating method according to claim 10, wherein a plurality of read voltage codes are further stored in the read retry table.

18. The operating method according to claim 17, wherein during the read retry operation, a read voltage and the sensing current are changed depending on the plurality of read voltage codes and the plurality of evaluation time codes.

19. The operating method according to claim 18, wherein when only the plurality of evaluation time codes are used, the read voltage is used as a constant voltage set as a default.

20. The operating method according to claim 10, wherein precharge voltage codes are further stored in the read retry table.

21. A memory system comprising:
a memory controller configured to include a read retry table including a plurality of strobe time codes, and to output a selected code among the plurality of strobe time codes during a read retry operation; and
a memory device configured to store data, and perform the read retry operation according to the selected code received from the memory controller, and
wherein the plurality of strobe time codes determine read data acquired from the read retry operation by changing a sensing current flowing through a memory cell.

22. The memory system according to claim 21, wherein the plurality of strobe time codes comprise codes to set currents that function as references for determining, during the read retry operation, whether selected memory cells have been programmed or erased.

23. The memory system according to claim 21, wherein the plurality of strobe time codes comprise codes to set voltages that function as references for determining, during the read retry operation, whether selected memory cells have been programmed or erased.

24. The memory system according to claim 21, wherein the plurality of strobe time codes comprise codes to set voltages and currents that function as references for determining, during the read retry operation, whether selected memory cells have been programmed or erased.

* * * * *